United States Patent
Xiao et al.

(10) Patent No.: US 12,065,726 B2
(45) Date of Patent: Aug. 20, 2024

(54) MASK ASSEMBLY AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Leifang Xiao, Beijing (CN); Guoqiang Ma, Beijing (CN); Peng Xu, Beijing (CN); Jiancheng Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 171 days.

(21) Appl. No.: 17/309,828

(22) PCT Filed: Dec. 29, 2020

(86) PCT No.: PCT/CN2020/140567
§ 371 (c)(1),
(2) Date: Jun. 21, 2021

(87) PCT Pub. No.: WO2021/147624
PCT Pub. Date: Jul. 29, 2021

(65) Prior Publication Data
US 2022/0307121 A1    Sep. 29, 2022

(30) Foreign Application Priority Data
Jan. 22, 2020   (CN) .......................... 202010076164.8

(51) Int. Cl.
*C23C 14/04*      (2006.01)
*B23K 26/20*     (2014.01)

(52) U.S. Cl.
CPC ............ *C23C 14/042* (2013.01); *B23K 26/20* (2013.01)

(58) Field of Classification Search
CPC .................................................. C23C 14/042
See application file for complete search history.

(56) References Cited

U.S. PATENT DOCUMENTS 5,637,917 A * 6/1997 Tomita .............. H01L 23/49537
                                                                    257/676
2002/0025406 A1* 2/2002 Kitazume ............... B32B 15/04
                                                                    428/136

(Continued)

FOREIGN PATENT DOCUMENTS

CN       102593376 A     7/2012
CN       106583958 A     4/2017

(Continued)

OTHER PUBLICATIONS

English translation CN 109338294, Feb. 2019, Pan (Year: 2019).*

(Continued)

*Primary Examiner* — Keath T Chen
(74) *Attorney, Agent, or Firm* — Nath, Goldberg & Meyer; Joshua B. Goldberg

(57) ABSTRACT

Embodiments of the present disclosure provide a mask assembly and a manufacturing method thereof. The mask assembly includes: a frame; a mask provided with a mask area and connection areas positioned on opposite sides of the mask area; and a plurality of first connection parts in each connection area, wherein the plurality of first connection parts in each connection area are arranged in M rows and N columns, each row includes a plurality of first connection parts, each column includes at least one first connection part, and in the same connection area, the first connection parts of any two adjacent rows are arranged in a staggered manner, (Continued)

where each of M and N is an integer larger than 1, and the mask is fixed to the frame via the plurality of first connection parts.

18 Claims, 8 Drawing Sheets

(56) References Cited

U.S. PATENT DOCUMENTS

| | | | |
|---|---|---|---|
| 2005/0246867 A1* | 11/2005 | Nagata | F16L 3/137 24/20 R |
| 2010/0267227 A1* | 10/2010 | Ko | C23C 14/042 156/60 |
| 2012/0174862 A1* | 7/2012 | Lee | B05C 21/005 118/504 |
| 2017/0263867 A1 | 9/2017 | Kim | |
| 2017/0268093 A1* | 9/2017 | Ji | C23C 14/042 |
| 2020/0086347 A1* | 3/2020 | Hirao | B06B 1/064 |

FOREIGN PATENT DOCUMENTS

| | | | |
|---|---|---|---|
| CN | 108441814 A | 8/2018 | |
| CN | 208266254 U | 12/2018 | |
| CN | 109182964 A | 1/2019 | |
| CN | 109338294 A | 2/2019 | |
| CN | 109778112 A | 5/2019 | |
| CN | 110359010 A | 10/2019 | |
| CN | 110359011 * | 10/2019 | ........... C23C 14/042 |
| CN | 110359011 A | 10/2019 | |
| CN | 111074205 A | 4/2020 | |
| KR | 10-2009-0040618 A | 4/2009 | |
| WO | 2019/171455 A1 | 9/2019 | |

OTHER PUBLICATIONS

English translation WO 2019171455, Sep. 2019, Yang (Year: 2019).*
Office Action dated Mar. 12, 2021 issued in corresponding Chinese Application No. 202010076164.8.
Office Action dated Aug. 12, 2021 issued in corresponding Chinese Application No. 202010076164.8.

* cited by examiner

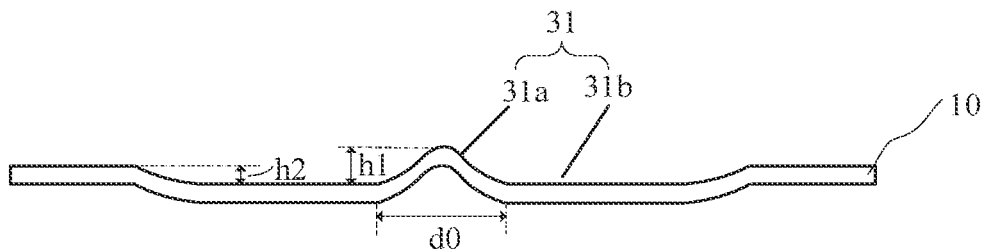

FIG. 10

| Provide a frame and a mask, the mask is provided with a mask area and connection areas positioned on opposite sides of the mask | S101 |

↓

| Form a plurality of first connection parts in each connection area, and connecting the mask to the frame via the plurality of first connection parts, wherein the plurality of first connection parts in each connection area are arranged in M rows and N columns, each row includes a plurality of first connection parts, each column includes at least one first connection part, and in the same connection area, the first connection parts of any two adjacent rows are arranged in a staggered manner | S102 |

FIG. 11

MASK ASSEMBLY AND MANUFACTURING METHOD THEREOF

CROSS-REFERENCE TO RELATED APPLICATIONS

This is a National Phase Application filed under 35 U.S.C. 371 as a national stage of PCT/CN2020/140567, filed on Dec. 29, 2020, an application claiming the priority of the Chinese patent application No. 202010076164.8 filed on Jan. 22, 2020, the contents of which are incorporated herein by reference in their entirety.

TECHNICAL FIELD

The present disclosure relates to the field of manufacturing of display products, and particularly relates to a mask assembly and a manufacturing method thereof.

BACKGROUND

The Organic Light-Emitting Diode (OLED) display technology has advantages of self-luminescence, high brightness, good image quality, and power saving, and has become a mainstream development trend in the field of display technology.

In the manufacture of organic light-emitting display devices, an evaporation method, with the assistant of Fine Metal Mask (FMM), is generally adopted to evaporate an organic light-emitting material onto the display backplane through a evaporation opening on the mask. In this way, various colors of organic materials are evaporated on the corresponding positions.

SUMMARY

The present disclosure aims to provide a mask assembly and a manufacturing method thereof which improve the position accuracy of the evaporation opening in the mask.

In order to achieve the above object, the present disclosure provides a mask assembly, including:
a frame;
a mask provided with a mask area and connection areas positioned on opposite sides of the mask area; and
a plurality of first connection parts in each connection area, wherein the plurality of first connection parts in each connection area are arranged in M rows and N columns, each row includes a plurality of first connection parts, each column includes at least one first connection part, and in the same connection area, the first connection parts of any two adjacent rows are arranged in a staggered manner, where each of M and N is an integer larger than 1, and the mask is fixed to the frame via the plurality of first connection parts.

Optionally, $M>2$, and more than one first connection part is arranged at the $i^{th}$ column, where $0<i\leq N$, and i is an odd number.

Optionally, the number of the first connection part in each column is one.

Optionally, the number of the first connection part in each row is an odd number.

Optionally, each two adjacent rows of first connection parts have the same distance in a column direction, and each two adjacent columns of first connection parts have the same distance in a row direction.

Optionally, the distance between two adjacent rows of first connection parts in the column direction equals to the distance between two adjacent columns of first connection parts in the row direction.

Optionally, an orthographic projection of the first connection part on the frame is a circle with a diameter of 300 μm to 500 μm, a distance between any two adjacent rows of first connection parts in a column direction is in the range of 1000 μm to 1300 μm; and
a distance between any two adjacent columns of first connection parts in a row direction is in the range of 1000 μm to 1300 μm.

Optionally, M is 3.

Optionally, the mask assembly further includes at least one second connection part and at least one third connection part in each connection area, the second connection part is disposed in the same column as the first connection part of the first column, and each second connection part is disposed in the same row as the first connection parts of one of the rows; the third connection part is disposed in the same column as the first connection part of the $N^{th}$ column, and each third connection part is disposed in the same row as the first connection parts of one of the rows; and the first connection part of the first column and the second connection part are arranged into M rows, and the first connection part of the $N^{th}$ column and the third connection part are arranged into M rows.

Optionally, the minimum distance in a row direction from an edge of the mask extending along a column direction to the first connection part immediate adjacent thereto is between 0.3 mm and 0.6 mm.

Optionally, the first connection parts on the opposite sides of the mask area are symmetrically distributed.

Optionally, the first connection part includes a convex portion and a concave portion surrounding the convex portion, the convex portion protrudes away from the frame, a vertical distance between a bottom end of the concave portion and a surface of a flat portion of the mask is between 3 μm and 8 μm, and a vertical distance between a top end of the convex portion and the bottom end of the concave portion is between 10 μm and 20 μm.

Accordingly, the present disclosure further provides a manufacturing method of a mask assembly, including:
providing a frame and a mask, wherein the mask is provided with a mask area and connection areas positioned on opposite sides of the mask;
forming a plurality of first connection parts in each connection area, and connecting the mask to the frame via the plurality of first connection parts, wherein the plurality of first connection parts in each connection area are arranged in M rows and N columns, each row includes a plurality of first connection parts, each column includes at least one first connection part, and in the same connection area, the first connection parts of any two adjacent rows are arranged in a staggered manner, where each of M and N is an integer larger than 1.

Optionally, the number of the first connection part in each row is an odd number greater than 3, the plurality of first connection parts in each row are distributed uniformly, and the first connection parts in each connection area are formed row by row, and wherein forming each row of first connection parts includes:
determining a plurality of target positions in one-to-one correspondence with the plurality of first connection parts in the row;

forming the first connection part at a target position corresponding to a row midpoint, the row midpoint being a midpoint between a head target position and a tail target position;

forming the first connection parts at the head target position and the tail target positions, respectively; and forming the first connection parts one by one at the remaining target positions where no first connection part is formed.

Optionally, forming the first connection parts one by one at the remaining target positions where no first connection part is formed includes: repeating a preset connection process until each target position is formed with the first connection part;

wherein the preset connection process includes:

taking a midpoint between every two adjacent first connection parts, among a plurality of first connection parts currently formed, as a segment midpoint; and forming the first connection parts at the target positions corresponding to the respective segment midpoints.

Optionally, in the step of forming the first connection parts at the target positions corresponding to the respective segment midpoints, for the target positions corresponding to any two segment midpoints which have different distances to a row center, first forming the first connection part at the target position closer to the row midpoint, and then forming the first connection part at the target position farther from the row midpoint.

Optionally, in each connection area, the first connection parts are formed row by row along a direction away from the mask area.

Optionally, the first connection parts on the opposite sides of the mask area are symmetrically distributed; and the two first connection parts on the opposite sides of the mask area and symmetrically distributed are simultaneously formed.

Optionally, the manufacturing method further includes:

forming at least one second connection part and at least one third connection part in each connection area, wherein the second connection part is disposed in the same column as the first connection part of the first column, and each second connection part is disposed in the same row as the first connection parts of one of the rows; the third connection part is disposed in the same column as the first connection part of the $N^{th}$ column, and each third connection part is disposed in the same row as the first connection parts of one of the rows; and the first connection part of the first column and the second connection part are arranged into M rows, and the first connection part of the $N^{th}$ column and the third connection part are arranged into M rows.

Optionally, the first connection part, the second connection part, and the third connection part are each formed by laser irradiation on the mask.

BRIEF DESCRIPTION OF THE DRAWINGS

Accompanying drawings are provided for further understanding of this disclosure and constitute a part of the description. These drawings are intended to explain the present disclosure together with the following specific embodiments, but should not be considered as a limitation of the disclosure. In the drawings:

FIG. 10 is a cross-sectional view taken along line A-A' of FIG. 9;

FIG. 11 is a flowchart of a manufacturing method of a mask assembly provided in some embodiments of the present disclosure;

DETAILED DESCRIPTION

Hereinafter, specific embodiments of the present disclosure will be described with respect to the accompanying drawings. It will be appreciated that the specific embodiments as set forth herein are merely for the purpose of illustration and explanation of the disclosure and should not be constructed as a limitation thereof.

The terms used herein for describing embodiments of the present disclosure is not intended to limit and/or define the scope of the disclosure. For example, unless otherwise defined, technical or scientific terms used in the present disclosure have general meanings as understood by those of ordinary skill in the art. It should be understood that the words "first", "second" and the like used in the present disclosure do not denote any order, quantity, or importance, but are used merely for distinguishing different components. The terms such as "a," "an," "the," etc., are not intended to indicate a limitation of quantity, but indicate the presence of at least one, unless the context clearly dictates otherwise.

It will be further understood that the term "comprising," "comprise," "including," "included," etc., are intended to specify that the elements or the objects stated before these terms encompass the elements or the objects and equivalents thereof listed after these terms, but do not preclude the other elements or objects. The terms "connected" or "coupled" and the like are not restricted to physical or mechanical connections, but may include electrical connections, directly or indirectly. The words "upper", "lower", "left", "right", or the like are merely used to indicate a relative positional relationship, and when an absolute position of the described object is changed, the relative positional relationship may also be changed accordingly.

In the manufacture of organic light-emitting display devices, an evaporation method is adopted to form an organic light-emitting layer in each pixel area of the display substrate. The mask used in the evaporation process is typically a fine metal mask which has a mask area provided with a plurality of evaporation openings. The mask is very thin, and thus, in the manufacture of the mask, the opposite ends of the mask are usually fixed to a frame by welding after the mask area is formed on the mask. In addition, the mask is usually stretched at opposite ends to cause the mask to generate a certain strength.

Figure 1:
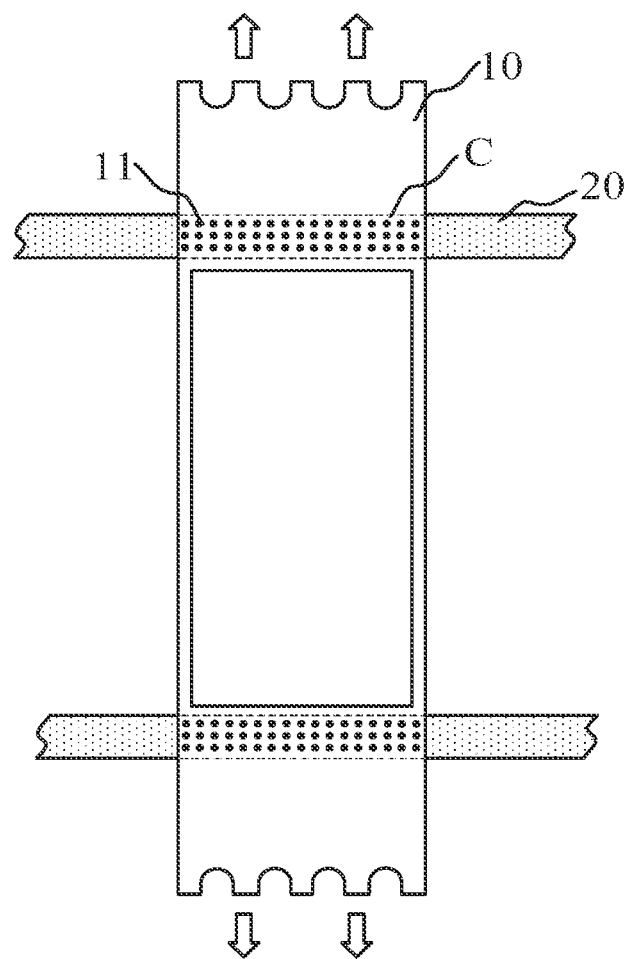
FIG. 1 is a schematic diagram of a mask and a frame in a comparative example.
Figure 2:
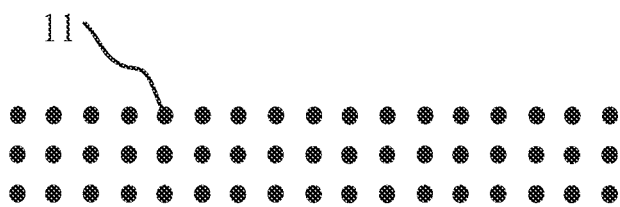
FIG. 2 is a schematic diagram showing distribution of welding points in the connection area of FIG. 1.

FIG. 1 is a schematic diagram of a mask and a frame in a comparative example, and FIG. 2 is a schematic diagram showing distribution of welding points in the connection areas of FIG. 1. As shown in FIGS. 1 and 2, two connection areas C of a mask 10 are fixed to a frame 20 via a plurality of welding points 11, and in each connection area C, a plurality of welding points 11 are distributed in a regular array, i.e., welding points 11 of each two adjacent rows are aligned. In this case, when the mask 10 is stretched (that is, when tensile forces are respectively applied to both ends of the mask 10 in a direction indicated by the arrows in FIG. 1), the stress on the connection area C is not uniform, which may cause the evaporation openings of the mask 10 to shift in positional during welding, and thus affect the position accuracy of the evaporation openings. Especially for a large-size mask, the welding time is prolonged due to the large width of the mask; and therefore the tensile force is also increased due to a large weight of the mask, leading to large changes in the positions of the evaporation openings during welding. If the position accuracy of the evaporation openings of the mask 10 is reduced, the organic light-emitting display device manufactured with the mask 10 will exhibit a poor color mixing.

Figure 3:
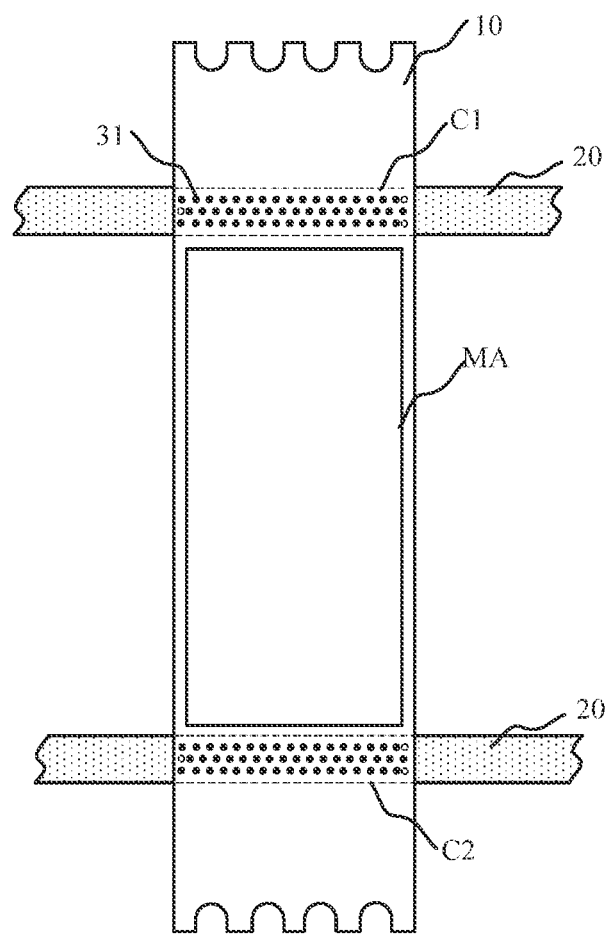
FIG. 3 is a schematic diagram of a mask assembly provided in some embodiments of the present disclosure.
Figure 4:
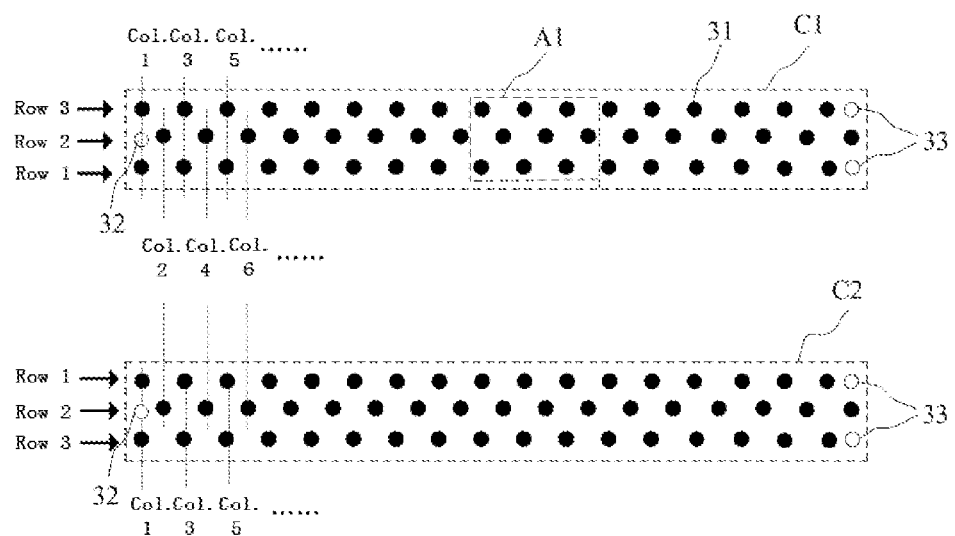
FIG. 4 is a schematic diagram of two connection areas in FIG. 3.

As an aspect of the present disclosure, there is provided a mask assembly. FIG. 3 is a schematic diagram of a mask assembly provided in some embodiments of the present disclosure, and FIG. 4 is a schematic diagram of the two connection areas in FIG. 3. As shown in conjunction with FIGS. 3 and 4, the mask assembly includes a frame 20 and a mask 10, wherein the mask 10 has a mask area MA and connection areas C1, C2 positioned on two opposite sides of the mask area MA. Specifically, the connection areas C1 and C2 are located on the opposite sides of the mask area MA in a preset stretching direction, which is a direction of a tensile force applied to the mask 10 when fixedly connecting the mask 10 to the frame 20. For example, the preset stretching direction is a length direction of the mask 10. In this case, the connection areas C1 and C2 are respectively provided on the opposite sides of the mask area MA in the length direction.

The mask assembly further includes a plurality of first connection parts 31 located in each connection area C1/C2. The plurality of first connection parts 31 in each connection area C1/C2 are arranged in M rows and N columns, each row includes a plurality of first connection parts 31, and an arrangement direction of the plurality of first connection parts 31 in each row is perpendicular to the preset stretching direction. Each column includes at least one first connection part 31. In the same connection area, the first connection parts 31 of any two adjacent rows are arranged in a staggered manner, where each of M and N is a positive integer larger than 1, and the mask 10 is fixed to the frame 20 via the plurality of first connection parts 31.

In some embodiments, the mask 10 is a metal mask 10 and is welded to the frame 20, and the first connection part 31 is a welding point formed by melting the mask 10 with laser irradiation.

It should be noted that, the first connection parts 31 of any two adjacent rows being arranged in a staggered manner means that the first connection parts 31 of any two adjacent rows are alternately arranged in the row direction, the first connection parts 31 of any two adjacent rows do not overlap each other in the column direction, and the first connection parts 31 of any two adjacent columns do not overlap each other in the row direction. That is, in any two adjacent rows, any two first connection parts 31 are not in the same column; and two adjacent first connection parts 31 in the same column are not located in adjacent rows. For example, in the connection areas C1 and C2 shown in FIG. 4, the $1^{st}$ first connection part 31 from the left in row 1 is located at column 1, the $1^{st}$ first connection part 31 from the left in row 2 is located at column 2, the $2^{nd}$ first connection part 31 from the left in row 1 is located at column 3, the $2^{nd}$ first connection part 31 from the left in row 2 is located at column 4, so on and so forth.

The mask 10 provided in the embodiment of the present disclosure is particularly suitable for a wide mask 10, for example, a mask 10 having a length of about 1200 mm, and a width of about 150 mm; and for another example, a mask 10 having a length of about 1200 mm, and a width of about 350 mm. For the mask 10 having a length of about 1200 mm, if the number of rows of the first connection parts 31 is too small, the capacity of bearing tensile force is insufficient. In order to enable the first connection parts 31 in the connection areas C1 and C2 as a whole to bear sufficient tensile force, in some embodiments of the present disclosure, the number of rows M of the first connection parts 31 satisfies M>2. In addition, the inventor has found that, when there are too many rows of first connection parts 31, more wrinkles are generated in the mask 10 during welding of the mask 10 and the frame 20, and the sizes of the connection areas C1 and C2 in the column direction are limited, leading to limited rows of first connection parts 31. Therefore, in order to reduce wrinkles on the mask 10, in some specific examples, the number of rows M of the first connection parts 31 in each connection area is 3, and the sizes of the connection areas C1 and C2 in the column direction are each about 5 mm. The number of the first connection part 31 in each row is an odd number.

In some embodiments, as shown in FIG. 4, more than one first connection parts 31 are arranged at column i, where $0<i\leq N$, and i is an odd number. It should be noted that, in the embodiments of the present disclosure, column 1 is the leftmost column in FIG. 6; and column i is the $i^{th}$ column from left in FIG. 6.

When M=3, the number of the first connection part 31 at column i+1 (e.g., columns 2, 4, 6, etc.) is 1; and when M>3, the number of the first connection part 31 at column i+1 is greater than 1. Specifically, the $1^{st}$ first connection part 31 in row 1 and the $1^{st}$ first connection part 31 in row 3 are located at column 1, the $1^{st}$ first connection part 31 in row 2 is located at column 2, the $2^{nd}$ first connection part 31 in row 1 and the $2^{nd}$ first connection part 31 in row 3 are located at column 3, the $2^{nd}$ first connection part 31 in row 2 is located at column 4, so on and so forth.

Figure 5:
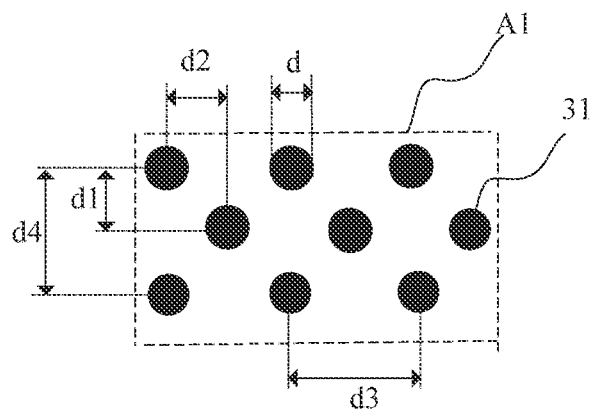
FIG. 5 is an enlarged view of area A1 in FIG. 4.

FIG. 5 is an enlarged view of area A1 in FIG. 4. As shown in FIGS. 4 and 5, optionally, each two adjacent rows of first connection parts 31 have the same distance in the column direction, which is d1 (that is, the distance between any first connection part in a row and any first connection part in an adjacent row is always d1 in the column direction); and each two adjacent columns of first connection parts 31 have the same distance in the row direction, which is d2 (that is, the distance between any first connection part in a column and any first connection part in an adjacent column is always d2 in the row direction), so the connection area C1/C2 is uniformly stressed on the whole. Meanwhile, center connection lines between every two of the first connection parts 31 at column k in row 2, the first connection parts 31 at column k−1 in row 1, and the first connection parts 31 at column k+1 in row 1 form an isosceles triangle; and center connection lines between every two of the first connection parts 31 at column k in row 2, the first connection parts 31 at column k−1 in row 3, and the first connection parts 31 at column k+1 in row 3 forms an isosceles triangle, where k is an even number greater than 1 and smaller than N. Obviously, d1 and d2 may be adjusted such that center connection lines between every two of the first connection parts 31 at column k in row 2, the first connection parts 31 at column k−1 in row 1, and the first connection parts 31 at column k+1 in row 1 form an equilateral triangle.

It should be noted that, in the embodiment of the present disclosure, the distance d1 between two adjacent rows of the first connection parts 31 in the column direction refers to a distance in the column direction between the centers of two first connection parts 31 respectively located in two adjacent rows; and the distance d2 between two adjacent columns of first connection parts 31 in the row direction refers to a distance in the row direction between the centers of two first connection parts 31 respectively located in two adjacent columns. Likewise, the distance between two adjacent first connection parts 31 in the same row refers to a distance between the centers of two adjacent first connection parts 31 in the same row; and the distance between two adjacent first connection parts 31 in the same column refers to a distance between the centers of two adjacent first connection parts 31 in the same column.

Further, the distance d1 between two adjacent rows of first connection parts 31 in the column direction equals to the distance d2 between two adjacent columns of first connection parts 31 in the row direction. At this time, as shown in FIG. 4, the $1^{st}$ first connection part 31 in row 1, the $1^{st}$ first connection part 31 in row 2, and the $2^{nd}$ first connection part 31 in row 3 are located on the same line, which line forms an angle of 45° with the row direction. Center connection lines between every two of the first connection parts 31 at column k in row 2, the first connection parts 31 at column k−1 in row 1, and the first connection parts 31 at column k+1 in row 1 form an isosceles right triangle.

As shown in FIG. 5, in a specific example, an orthographic projection of the first connection part 31 on the frame 20 is a circle with a diameter d of 300 μm to 500 μm, the distance d1 between any two adjacent rows of first connection parts 31 in the column direction is in the range of 1000 μm to 1300 μm; and the distance d2 between any two adjacent columns of first connection parts 31 in the row direction is in the range of 1000 μm to 1300 μm. In practical applications, both d1 and d2 are greater than d. For example, d is in the range of 300 μm to 350 μm, while d1 and d2 are each in the range of 1000 μm to 1100 μm. For another example, d is in the range of 350 μm to 400 μm, while d1 and d2 are each in the range of 1100 μm to 1200 μm. For another example, d is in the range of 400 μm to 500 μm, while d1 and d2 are each in the range of 1200 μm to 1300 μm. In a specific example, d=300 μm, and d1=d2=1000 μm. When the first connection parts 31 in the connection areas are arranged in the manner as shown in the figure, a distance d3 between any two adjacent first connection parts 31 in each row is 2000 μm, a distance d4 between any two adjacent first connection parts 31 in an odd column is 2000 μm.

The minimum distance in the row direction from an edge of the mask 10 extending along the column direction to the first connection part 31 immediate adjacent thereto is between 0.3 mm and 0.6 mm. The edge of the mask 10 extending along the column direction refers to either a left edge or a right edge of the mask 10. For any of the left edge and the right edge, the first connection part 31 immediate adjacent thereto refers to the first connection part(s) 31 having the shortest distance to the edge. For example, for the left edge of the mask 10, the first connection part 31 immediate adjacent thereto is the first connection part 31 at column 1, and the minimum distance between the first connection part 31 and the left edge in the row direction is: a vertical distance from a left end of the first connection part 31 to the left edge; and for the right edge of the mask 10, the first connection part 31 immediate adjacent thereto is the first connection part 31 at the last column, and the minimum distance between the first connection part 31 and the right edge in the row direction is: a vertical distance from a right end of the first connection part 31 to right edge.

As shown in FIG. 4, the first connection parts 31 on the opposite sides of the mask area MA are symmetrically distributed. Specifically, in each connection area, the row closest to the mask area MA is the first row (row 1), the row farthest away from the mask area MA is the last row, the plurality of first connection parts 31 in row m on the upper side of the mask area MA are aligned with the plurality of first connection parts 31 in row m on the lower side of the mask area MA one by one in the column direction, where 1≤m≤M, and m is an integer.

As shown in FIGS. 3 and 4, the mask assembly further includes, in each connection area C1/C2, at least one second connection part 32 and at least one third connection part 33. The second connection part 32 is disposed in the same column as the first connection parts 31 of the first column (column 1), and each second connection part 32 is disposed in the same row as the first connection parts 31 of one of the rows. The third connection parts 33 are disposed in the same column as the first connection parts 31 of the $N^{th}$ column, and each third connection part 33 is disposed in the same row as the first connection parts 31 of one of the rows. The first connection parts 31 of the first column and the second connection part 32 are arranged into M rows, and the first connection parts 31 of the $N^{th}$ column and the third connection part 33 are arranged into M rows. For the case shown in FIG. 4 where three rows of the first connection parts 31 are provided, the second connection part 32 is located at the first column, the third connection parts 33 are located at the last column, the second connecting part 32 is arranged in the same row as the first connection parts 31 of the second row, and the two third connection parts 33 are arranged in the same row as the first connection parts 31 of the first row and the first connection parts 31 of the third row, respectively.

Figure 6:
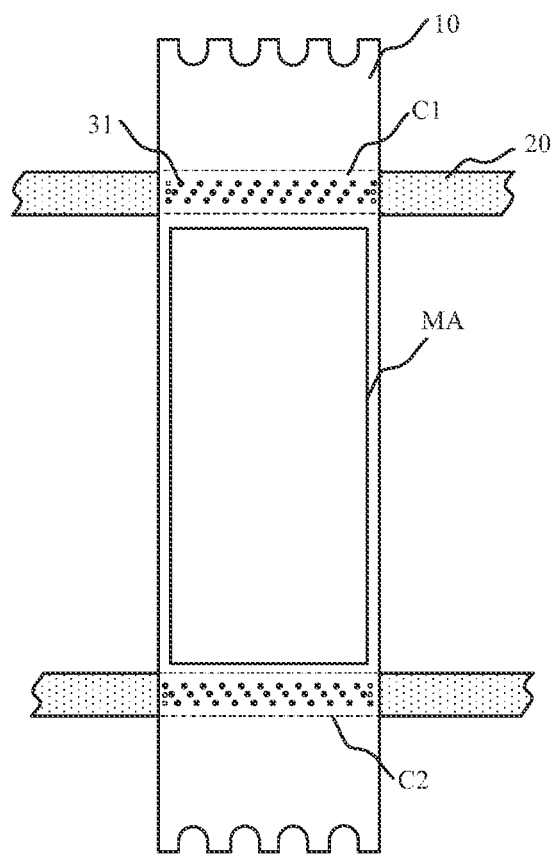
FIG. 6 is a schematic diagram of a mask assembly provided in further embodiments of the present disclosure.
Figure 7:
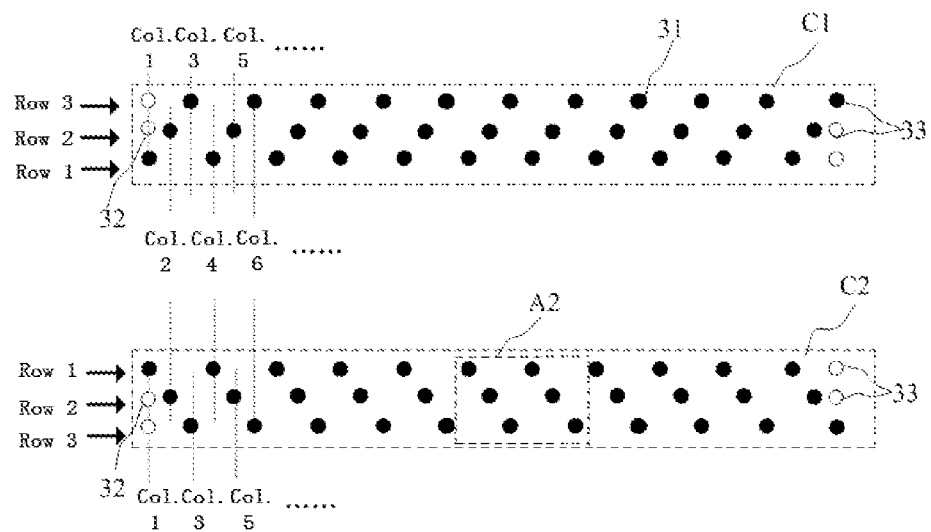
FIG. 7 is a schematic diagram of two connection areas in FIG. 6.
Figure 8:
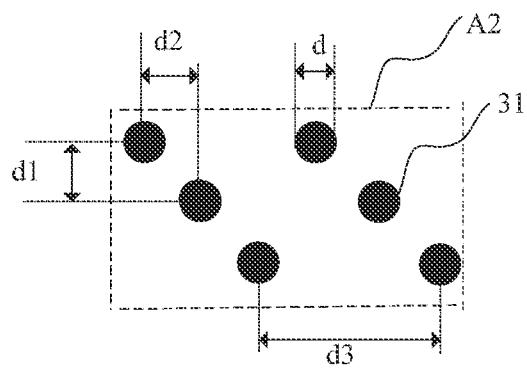
FIG. 8 is an enlarged schematic diagram of area A2 in FIG. 7.

FIG. 6 is a schematic diagram of a mask assembly provided in further embodiments of the present disclosure, FIG. 7 is a schematic diagram of the two connection areas in FIG. 6, and FIG. 8 is an enlarged schematic diagram of area A2 in FIG. 7. In these further embodiments, as shown in FIGS. 6 to 8, the plurality of first connection parts 31 in each connection area C1/C2 are arranged in multiple rows and columns, and the first connection parts 31 of any two adjacent rows are arranged in a staggered manner. Unlike the embodiment shown in FIG. 3, in FIGS. 6 to 8, the number of the first connection part 31 in each column is one. That is, when M>2, any two rows of first connection parts 31 are arranged in a staggered manner.

Similar to the embodiment shown in FIG. 3, in FIGS. 6 to 8, the number of rows M of the first connection parts 31 in each connection area is 3, and the number of the first connection part 31 in each row is an odd number. Each two adjacent rows of first connection parts 31 have the same distance d1 in the column direction, and each two adjacent columns of first connection parts 31 have the same distance d2 in the row direction. Furthermore, the distance d1 between two adjacent rows of first connection parts 31 in the column direction equals to the distance d2 between two adjacent columns of first connection parts 31 in the row direction. In this case, the plurality of first connection parts 31 in the connection area C1/C2 may be divided into a plurality of groups arranged in the row direction, each group including three first connection parts 31. For example, the $1^{st}$ first connection part 31 in the first row, the $1^{st}$ first connection part 31 in the second row, and the $1^{st}$ first connection part 31 in the third row make up the first group; the $2^{nd}$ first connection part 31 in the first row, the $2^{nd}$ first connection part 31 in the second row, and the $2^{nd}$ first connection part 31 in the third row make up the second group; so on and so forth. The three first connection parts 31 in each group are arranged on a line which forms an angle of 45° with the row direction.

Similar to the embodiment shown in FIG. 3, in FIGS. 6 to 8, an orthographic projection of the first connection part 31 on the frame 20 is a circle with a diameter d of 300 μm to 500 μm, and the distance d1 between any two adjacent rows of first connection parts 31 in the column direction is in the range of 1000 μm to 1300 μm; and the distance d2 between any two adjacent columns of first connection parts 31 in the row direction is in the range of 1000 μm to 1300 μm. For example, d=300 μm, and d1=d2=1000 μm. It will be appreciated that when the arrangement manner shown in FIGS. 6 to 8 is adopted and d2=1000 μm, a distance d3 between any two adjacent first connection parts 31 in each row is 3000 μm.

In addition, similar to the embodiment shown in FIG. 3, in FIG. 6, the minimum distance in the row direction from an edge of the mask 10 extending along the column direction to the first connection part 31 immediate adjacent thereto is between 0.3 mm and 0.6 mm. The first connection parts 31 on the opposite sides of the mask area MA are symmetrically distributed. Each connection area C1/C2 is further provided with at least one second connection part 32 and at least one third connection part 33. The second connection part 32 is disposed in the same column as the first connection part 31 of the first column, and each second connection part 32 is disposed in the same row as the first connection parts 31 of one of the rows. The third connection parts 33 are disposed in the same column as the first connection part 31 of the $N^{th}$ column, and each third connection part 33 is disposed in the same row as the first connection parts 31 of one of the rows. The first connection part 31 of the first column and the second connection parts 32 are arranged into M rows, and the first connection part 31 of the $N^{th}$ column and the third connection parts 33 are arranged into M rows. For the arrangement manner shown in FIGS. 6 to 8, each connection area C1/C2 is provided with two second connection parts 32 and two third connection parts 33. The two second connection parts 32 are respectively located at column 1 in row 2, and column 1 in row 3; and the two third connection parts 33 are respectively located at the last column in row 2, and the last column in row 3.

Figure 9:
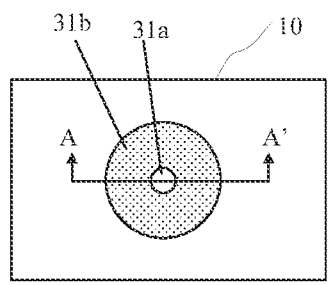
FIG. 9 is a top view of a first connection part according to some embodiments of the present disclosure.

The first connection part 31, the second connection part 32, and the third connection part 33 in the embodiments of the present disclosure may be welding points formed by a laser welding process. FIG. 9 is a top view of a first connection part according to some embodiments of the present disclosure, and FIG. 10 is a cross-sectional view taken along line A-A' of FIG. 9. As shown in FIGS. 9 and 10, the first connection part 31 includes a convex portion 31a and a concave portion 31b surrounding the convex portion 31a, wherein the convex portion 31a protrudes away from the frame 20, while the concave portion 31b is bent toward the frame 20.

A vertical distance h1 between a top end of the convex portion 31a and a bottom end of the concave portion 31a is between 10 μm and 20 μm, and a projection of the convex portion 31a on the frame 20 has a circular or approximately circular shape with a diameter d0 in the range of 40 μm to 60 μm. A depth h2 of the concave portion 31b is between 3 μm and 8 μm. In a specific example, the vertical distance h1 between a top end of the convex portion 31a and a bottom end of the concave portion 31a is 15 μm, the depth h2 of the concave portion 31b is 5 μm, the diameter of the convex portion 31a is 50 μm. It should be noted that the top end of the convex portion 31a is an end thereof away from the frame 20, and the bottom end of the concave portion 31b is an end thereof adjacent to the frame 20. The depth h2 of the concave portion 31b is a vertical distance from the bottom end of the concave portion 31b to a surface of a flat portion of the mask 10.

The second connection part 32 and the third connection part 33 each have the same profile as the first connection part 31, and are not described in detail here.

As another aspect of the present disclosure, there is further provided a manufacturing method of the above mask assembly. FIG. 11 is a flowchart of a manufacturing method of a mask assembly provided in some embodiments of the present disclosure. Referring to FIGS. 3, 6 and 11, the manufacturing method of the mask assembly includes the following steps S101 to S102.

At step S101, providing a frame 20 and a mask 10, wherein the mask 10 has a mask area MA and connection areas C1, C2 positioned on opposite sides of the mask 10. The phrase "opposite sides" herein may specifically refer to the two opposite sides of the mask 10 along a length direction thereof.

At step S102, forming a plurality of first connection parts 31 in each connection area, and connecting the mask 10 to the frame 20 via the plurality of first connection parts 31, wherein the plurality of first connection parts 31 in each connection area are arranged in M rows and N columns, each row includes a plurality of first connection parts, each column includes at least one first connection part 31, and in the same connection area, the first connection parts 31 of any two adjacent rows are arranged in a staggered manner, where each of M and N is a positive integer larger than 1.

Figure 12:
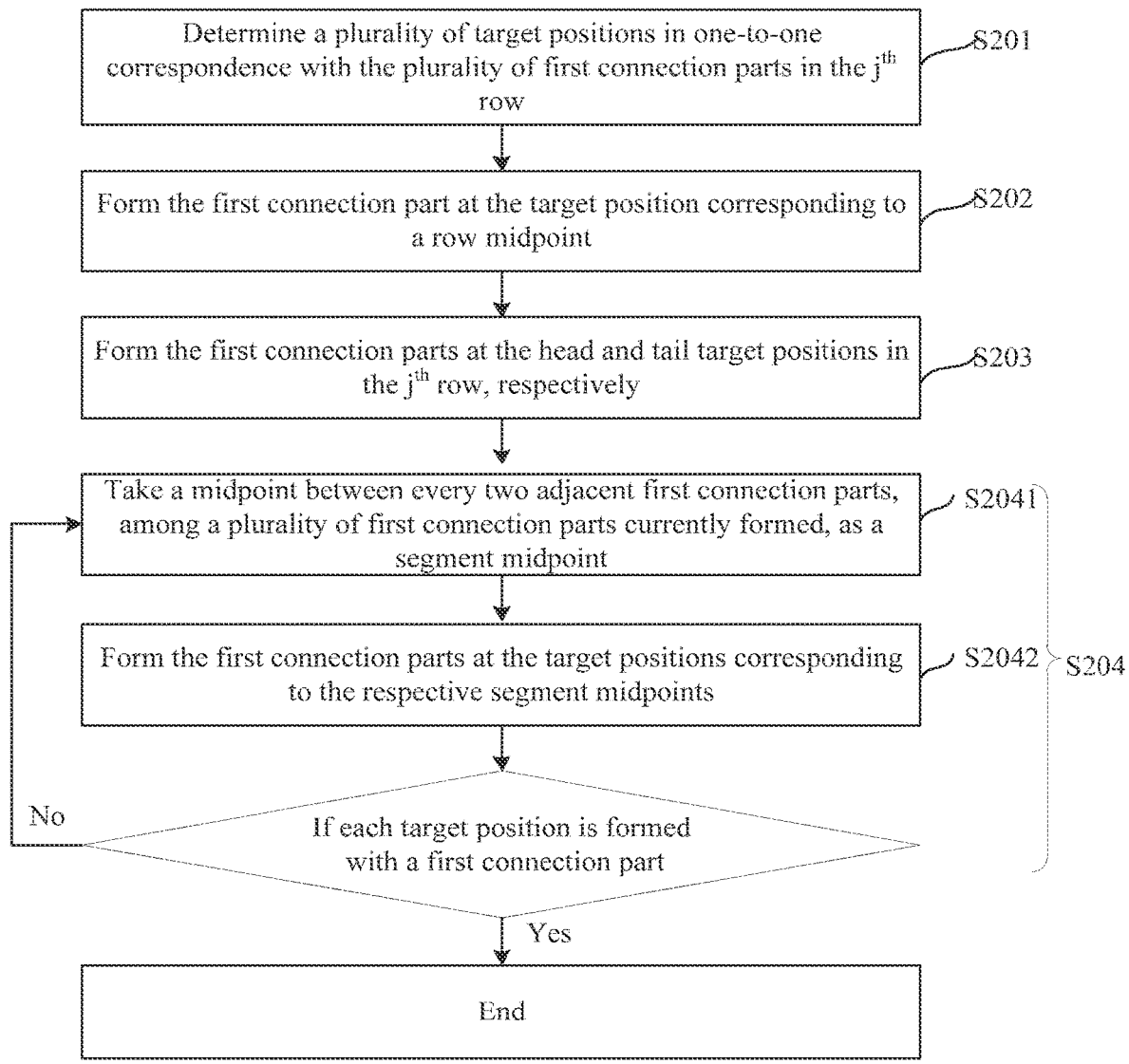
FIG. 12 is a flowchart of forming a $j^{th}$ row of first connection parts provided in some embodiments of the present disclosure.

In some embodiments, the number of the first connection part 31 in each row is an odd number greater than 3, and the plurality of first connection parts 31 in each row are distributed uniformly. The first connection parts 31 in each connection area are formed row by row. FIG. 12 is a flowchart of forming each row of first connection parts provided in some embodiments of the present disclosure, FIGS. 13 to 18 are schematic diagrams illustrating the process of forming each row of first connection parts according to the embodiments of the disclosure, and the numbers above the respective first connection parts 31 in FIGS. 14 to 18 represents an order of formation of the first connection parts 31. As shown in FIG. 12, the process of forming the $j^{th}$ (1≤j≤M and j is an integer) row of first connection parts 31 includes steps S201 to S204.

Figure 13:
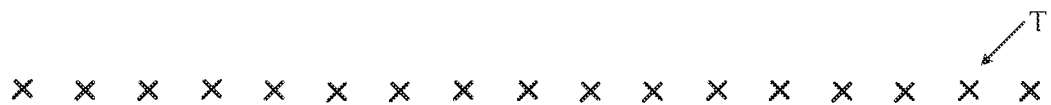
FIGS. 13 to 18 are schematic diagrams illustrating the process of forming each row of the first connection parts according to the embodiments of the disclosure.

At step S201, determining a plurality of target positions T in one-to-one correspondence with the plurality of first connection parts in the $j^{th}$ row. The plurality of target positions T are distributed as shown in FIG. 13, each used for forming a first connection part 31.

Figure 14:
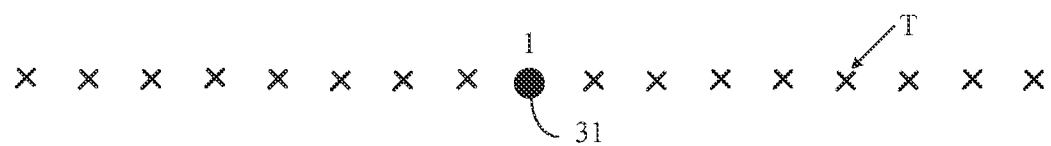

At step S202, forming the first connection part 31 at the target position T corresponding to a row midpoint, such as the first connection part 31 indicated by the reference number "1" in FIG. 14. The row midpoint refers to the midpoint between the head and tail target positions in the $j^{th}$ row.

Figure 15:
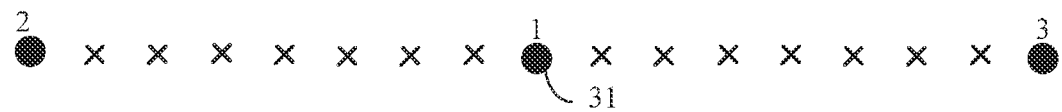

At step S203, forming the first connection parts 31 at the head and tail target positions T in the $j^{th}$ row, respectively, such as the first connection parts 31 indicated by the reference numbers "2" and "3" in FIG. 15. The order in which the first connection parts 31 are formed at the head and tail target positions T in the $j^{th}$ row is not limited.

Figure 16:
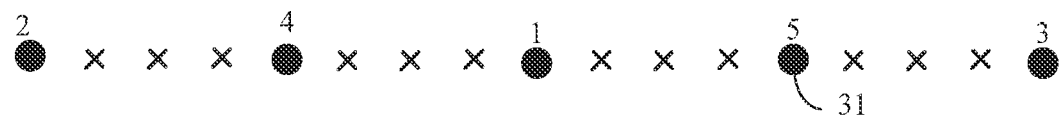
Figure 17:
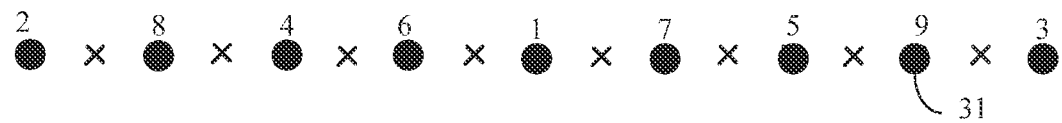
Figure 18:
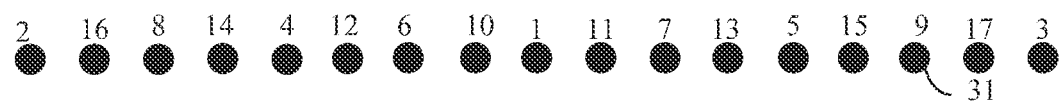

At step S204, forming the first connection parts 31 one by one at the remaining target positions T where no first connection parts 31 is formed, as shown in FIGS. 16 to 18. The step S204 includes: repeating a preset connection process until each target position T is formed with the first connection part. Specifically, the preset connection process includes the following steps S2041 to S2042.

At step S2041, taking a midpoint between every two adjacent currently formed first connection parts 31, among the plurality of currently formed first connection parts 31, as a segment midpoint.

At step S2042, forming the first connection parts 31 at the target positions T corresponding to the respective segment midpoints.

Alternatively, in step S2042, for the target positions T corresponding to any two segment midpoints which have different distances to a row center, first forming the first connection part at the target position T closer to the row midpoint, and then forming the first connection part at the target position T farther from the row midpoint. For example, after the nine first connection parts 31 of FIG. 17 are obtained, there is only one target position T where no first connection portion 31 is formed between every two adjacent first connection parts 31, and then, first connection parts 31 indicated by the reference numbers "10", "11", "12" ... "17" are formed sequentially. It can be seen that, each time step S2041 is performed, if there are a plurality of segment midpoints on both sides of the row center, then each time a first connection part 31 is formed on one side of the row center, a first connection part 31 is also symmetrically formed on the other side of the row center.

It should be noted that, whether the first connection parts 31 in the connection areas are arranged in the manner as shown in FIG. 4, or arranged in the manner as shown in FIG. 7, the forming process of each row of first connection parts 31 can be performed as shown in FIGS. 13 to 18. It should be noted that, in order to demonstrate the order of formation of the plurality of first connection parts 31 in each row, only 17 first connection parts 31 are schematically illustrated in each row in FIGS. 13 to 18, but in practical production, each row may include more than 17 first connection parts 31. For example, for a mask 10 having a width of 150 mm, the number of the first connection part 31 in each row is about 100, and for a mask 10 having a width of 350 mm, the number of the first connection part 31 in each row is about 200.

Optionally, each first connection part 31 may be formed by laser irradiation on the mask 10.

In the embodiment of the present disclosure, in the formation of each row of first connection parts 31, the first connection part 31 at the row center is formed first to fix a middle portion of the mask 10 to the frame 20. Then, each time a first connection part 31 is formed on one side of the row center, a first connection part 31 is also symmetrically formed on the other side of the row center so that the mask 10 is fixed to the frame 20 symmetrically, thereby reducing positional deviation during welding. In addition, as a whole, the first connection parts 31 in each row are sequentially formed from middle to both sides so that wrinkles on the mask 10 are far away from the mask area MA, and the position accuracy of the evaporation opening in the mask 10 is improved.

In some embodiments, in each of the connection areas C1 and C2, the first connection parts 31 are formed row by row along a direction away from the mask area MA. That is, in FIGS. 3 and 6, for the same connection area C1/C2, the row of first connection parts 31 closest to the mask area MA is formed first; and the row of first connection parts 31 farthest from the mask area MA is formed last, so that wrinkles on the mask 10 are far away from the mask area MA.

In some embodiments, the first connection parts 31 on the opposite sides of the mask area MA are symmetrically distributed. In this case, the two first connection parts 31 on the opposite sides of the mask area MA and symmetrically distributed may be simultaneously formed. In practical production, two laser-emitting devices may be used for laser irradiation on two target positions T at the same time to form two first connection parts 31 welded to the frame 20 simultaneously.

Figure 19:
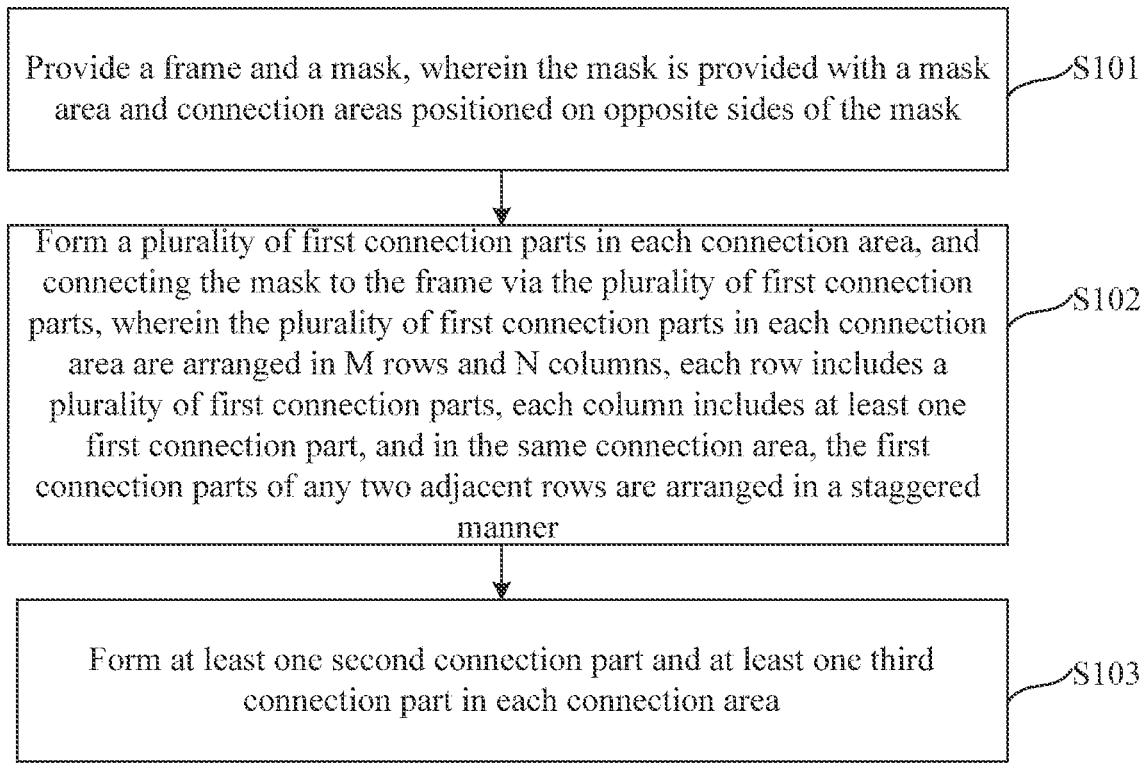
FIG. 19 is a flowchart of a manufacturing method of a mask assembly provided in further embodiments of the present disclosure.

FIG. 19 is a flowchart of a manufacturing method of a mask assembly provided in further embodiments of the present disclosure. As shown in FIG. 19, the manufacturing method further includes the following step S103 after steps S101 and S102.

At step S103, forming at least one second connection part 32 and at least one third connection part 33 in each connection area. The overall arrangement of the second connection parts 32, the third connection parts 33 and the first connection parts 31 is as shown in FIGS. 4 and 7, in which the second connection part(s) 32 is disposed in the same column as the first connection part(s) 31 of the first column, and each second connection part 32 is disposed in the same row as the first connection parts 31 of one of the rows; the third connection parts 33 are disposed in the same column as the first connection part 31 of the $N^{th}$ column, and each third connection part 33 is disposed in the same row as the first connection parts 31 of one of the rows; and the first connection part(s) 31 of the first column and the second connection part(s) 32 are arranged into M rows, while the first connection part(s) 31 of the $N^{th}$ column and the third connection parts 33 are arranged into M rows.

The second connection parts 32, and the third connection parts 33 are each formed by laser irradiation on the mask 10. It will be appreciated that the second connection parts 32 in the two connection areas C1 and C2 are also symmetrically distributed. In practical production, any two symmetrical second connection parts 32 may be formed simultaneously, and any two symmetrical third connection parts 33 may be formed simultaneously, so as to improve the production efficiency.

It will be appreciated that the above embodiments are merely exemplary implementations for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A mask assembly, including:
   a frame;

a mask provided with a mask area and a plurality of rectangular connection areas positioned on opposite sides of the mask area; and a plurality of connection parts in each one of the plurality of rectangular connection areas, wherein the plurality of connection parts in each one of the plurality of rectangular connection areas consist of a plurality of first connection parts, at least one second connection part and at least one third connection part, and wherein each of the plurality of connection parts is formed by laser irradiation on the mask, wherein the plurality of first connection parts in each one of the plurality of rectangular connection areas are arranged in M rows and N columns, each row includes some of the plurality of first connection parts, each column includes at least one first connection part of the plurality of first connection parts, and in the same one of the plurality of rectangular connection areas, the first connection parts of any two adjacent rows are arranged in a staggered manner, where each of M and N is an integer larger than 1, and the mask is fixed to the frame via the plurality of first connection parts, wherein in each one of the plurality of rectangular connection areas, the at least one second connection part is disposed in the same column as the first connection part of the first column, and each second connection part is disposed in the same row as the first connection parts of one of the rows; wherein the at least one third connection part is disposed in the same column as the first connection part of the $N^{th}$ column, and each third connection part is disposed in the same row as the first connection parts of one of the rows;

wherein in each one of the plurality of rectangular connection areas, the first connection parts of the first column and the at least one second connection part are arranged into M rows, and the first connection parts of the $N^{th}$ column and the at least one third connection part are arranged into M rows;

wherein the row or rows containing the at least one second connection part is different than the row or rows containing the at least one third connection part; and wherein the middle columns does not contain any of the second connection part and the third connection part.

2. The mask assembly according claim 1, wherein M>2, and more than one of the plurality of first connection parts is arranged at the $i^{th}$ column, where 0<i≤N, and i is an odd number.

3. The mask assembly according to claim 1, wherein the number of the first connection parts in each row is an odd number.

4. The mask assembly according to claim 1, wherein each two adjacent rows of first connection parts have the same distance in a column direction, and each two adjacent columns of first connection parts have the same distance in a row direction.

5. The mask assembly according to claim 4, wherein the distance between two adjacent rows of first connection parts in the column direction equals to the distance between two adjacent columns of first connection parts in the row direction.

6. The mask assembly according to claim 1, wherein an orthographic projection of each of the plurality of first connection parts on the frame is a circle with a diameter of 300 μm to 500 μm, a distance between any two adjacent rows of first connection parts in a column direction is in the range of 1000 μm to 1300 μm; and a distance between any two adjacent columns of first connection parts in a row direction is in the range of 1000 μm to 1300 μm.

7. The mask assembly according to claim 1, wherein M is 3.

8. The mask assembly according to claim 1, wherein the plurality of rectangular connection areas are positioned on opposite sides of the mask area in a column direction, and a distance in a row direction from an edge of the mask extending along the column direction to the first connection part in the column immediate adjacent thereto is between 0.3 mm and 0.6 mm.

9. The mask assembly according to claim 1, wherein the first connection parts on the opposite sides of the mask area are symmetrically distributed.

10. The mask assembly according to claim 1, wherein each first connection part of the plurality of first connection parts includes a convex portion and a concave portion surrounding the convex portion, the convex portion protrudes away from the frame, a vertical distance between a bottom end of the concave portion and a surface of a flat portion of the mask is between 3 μm and 8 μm, a vertical distance between a top end of the convex portion and the bottom end of the concave portion is between 10 μm and 20 μm, and the top end of the convex portion is located at a center of the convex portion.

11. A manufacturing method of a mask assembly, including:

providing a frame and a mask, wherein the mask is provided with a mask area and a plurality of rectangular connection areas positioned on opposite sides of the mask;

forming a plurality of first connection parts in each one of the plurality of rectangular connection areas, and connecting the mask to the frame via the plurality of first connection parts, wherein the plurality of first connection parts in each one of the plurality of rectangular connection areas are arranged in M rows and N columns, each row includes some of the plurality of first connection parts, each column includes at least one first connection part of the plurality of first connection parts, and in the same one of the plurality of rectangular connection areas, the first connection parts of any two adjacent rows are arranged in a staggered manner, where each of M and N is an integer larger than 1, and forming at least one second connection part and at least one third connection part in each one of the plurality of rectangular connection areas, wherein the second connection part is disposed in the same column as the first connection part of the first column, and each second connection part is disposed in the same row as the first connection parts of one of the rows; the third connection part is disposed in the same column as the first connection part of the $N^{th}$ column, and each third connection part is disposed in the same row as the first connection parts of one of the rows; the first connection part of the first column and the second connection part are arranged into M rows, and the first connection part of the $N^{th}$ column and the third connection part are arranged into M rows;

wherein the row or rows containing the at least one second connection part is different than the row or rows containing the at least one third connection part; and wherein the middle column does not contain any of the second connection part and the third connection part.

12. The manufacturing method according to claim 11, wherein the number of the first connection parts in each row is an odd number greater than 3, the first connection parts in each row are distributed uniformly, and the first connection parts in each one of the plurality of rectangular connection areas are formed row by row, and wherein forming each row of first connection parts includes:
   determining a plurality of target positions in one-to-one correspondence with the plurality of first connection parts in the row;
   forming one of the plurality of first connection parts in the row at a target position corresponding to a row midpoint, the row midpoint being a midpoint between a head target position and a tail target position;
   forming two of the plurality of first connection parts in the row at the head target position and the tail target position, respectively; and
   forming the remaining of the plurality of first connection parts in the row one by one at the remaining target positions where no first connection part is formed.

13. The manufacturing method according to claim 12, wherein forming the remaining of the plurality of first connection parts in the row one by one at the remaining target positions where no first connection part is formed includes: repeating a preset connection process until each target position is formed with one of the first connection parts;
   wherein the preset connection process includes:
   taking a midpoint between every two adjacent first connection parts, among a plurality of first connection parts currently formed, as a segment midpoint; and
   forming the first connection parts at the target positions corresponding to the respective segment midpoints.

14. The manufacturing method according to claim 13, wherein in the step of forming the first connection parts at the target positions corresponding to the respective segment midpoints, for the target positions corresponding to any two segment midpoints which have different distances to a row center, first forming one of the first connection parts at the target position closer to the row midpoint, and then forming another of the first connection parts at the target position farther from the row midpoint.

15. The manufacturing method according to claim 12, wherein, in each one of the plurality of rectangular connection areas, the first connection parts are formed row by row along a direction away from the mask area.

16. The manufacturing method according to claim 11, wherein the first connection parts on the opposite sides of the mask area are symmetrically distributed; and
   the two first connection parts on the opposite sides of the mask area and symmetrically distributed are simultaneously formed.

17. The manufacturing method according to claim 11, wherein the first connection parts, the second connection part, and the third connection part are each formed by laser irradiation on the mask.

18. The manufacturing method according to claim 11, wherein each first connection part of the plurality of first connection parts includes a convex portion and a concave portion surrounding the convex portion, the convex portion protrudes away from the frame, a vertical distance between a bottom end of the concave portion and a surface of a flat portion of the mask is between 3 μm and 8 μm, a vertical distance between a top end of the convex portion and the bottom end of the concave portion is between 10 μm and 20 μm, and the top end of the convex portion is located at a center of the convex portion.

* * * * *